United States Patent
Jakupi et al.

(10) Patent No.: US 11,177,642 B2
(45) Date of Patent: Nov. 16, 2021

(54) LOW COST HIGH FREQUENCY SENSOR FOR ARC-FAULT DETECTION

(71) Applicant: SCHNEIDER ELECTRIC USA, INC., Andover, MA (US)

(72) Inventors: Andi Jakupi, Marion, IA (US); Gary W. Scott, Mount Vernon, IA (US)

(73) Assignee: Schneider Electric USA, Inc., Andover, MA (US)

( * ) Notice: Subject to any disclaimer, the term of this patent is extended or adjusted under 35 U.S.C. 154(b) by 121 days.

(21) Appl. No.: 16/213,582

(22) Filed: Dec. 7, 2018

(65) Prior Publication Data

US 2020/0185902 A1    Jun. 11, 2020

(51) Int. Cl.
| | |
|---|---|
| H02H 1/00 | (2006.01) |
| G01R 31/12 | (2020.01) |
| H01F 17/04 | (2006.01) |
| H02H 3/16 | (2006.01) |
| H03H 7/38 | (2006.01) |

(52) U.S. Cl.
CPC ....... *H02H 1/0015* (2013.01); *G01R 31/1272* (2013.01); *H01F 17/04* (2013.01); *H02H 3/16* (2013.01); *H03H 7/38* (2013.01)

(58) Field of Classification Search
CPC .......... H02H 1/0015; H02H 3/16; H03H 7/38; H01F 17/04; G01R 31/1272
See application file for complete search history.

(56) References Cited

U.S. PATENT DOCUMENTS

| | | | |
|---|---|---|---|
| 4,858,054 A | 8/1989 | Franklin | |
| 5,682,101 A * | 10/1997 | Brooks | H01H 71/125 |
| | | | 324/536 |
| 5,834,940 A | 11/1998 | Brooks et al. | |
| 6,229,679 B1 * | 5/2001 | Macbeth | H02H 1/0015 |
| | | | 361/42 |
| 6,313,641 B1 * | 11/2001 | Brooks | H02H 1/0015 |
| | | | 324/536 |
| 6,426,634 B1 | 7/2002 | Clunn et al. | |
| 6,452,767 B1 * | 9/2002 | Brooks | H01H 71/125 |
| | | | 361/42 |
| 6,532,424 B1 * | 3/2003 | Haun | H01H 71/125 |
| | | | 323/282 |
| 6,625,550 B1 * | 9/2003 | Scott | H01H 71/125 |
| | | | 361/63 |
| 2003/0058596 A1 * | 3/2003 | MacBeth | G01R 15/183 |
| | | | 361/93.5 |
| 2006/0214668 A1 | 9/2006 | Mernyk et al. | |
| 2006/0262466 A1 * | 11/2006 | Engel | H02H 1/0015 |
| | | | 361/42 |

(Continued)

OTHER PUBLICATIONS

Extended European Search Report in related Application Serial No. 19213929.3-1010 dated Apr. 28, 2020.

*Primary Examiner* — Jue Zhang
(74) *Attorney, Agent, or Firm* — Locke Lord LLP

(57) ABSTRACT

Example embodiments of the invention include a powdered core bead body configured to become an inductive impedance to current signals with high frequencies in a power wire threaded through the powdered core bead body. The signals are detectable by a high frequency voltage sensor that is configured to output an arc fault tripping indication to an arc fault tripping circuit in response to an occurrence of high frequency current signals in the power wire.

9 Claims, 7 Drawing Sheets

(56) References Cited

U.S. PATENT DOCUMENTS

| | | | |
|---|---|---|---|
| 2009/0184787 A1* | 7/2009 | Weeks | H01H 71/58 |
| | | | 335/18 |
| 2014/0218044 A1* | 8/2014 | Ostrovsky | G01R 31/50 |
| | | | 324/509 |
| 2015/0219692 A1 | 8/2015 | Krah et al. | |
| 2016/0072271 A1* | 3/2016 | Packard | H02H 9/042 |
| | | | 361/42 |
| 2017/0117699 A1 | 4/2017 | Ostrovsky et al. | |

* cited by examiner

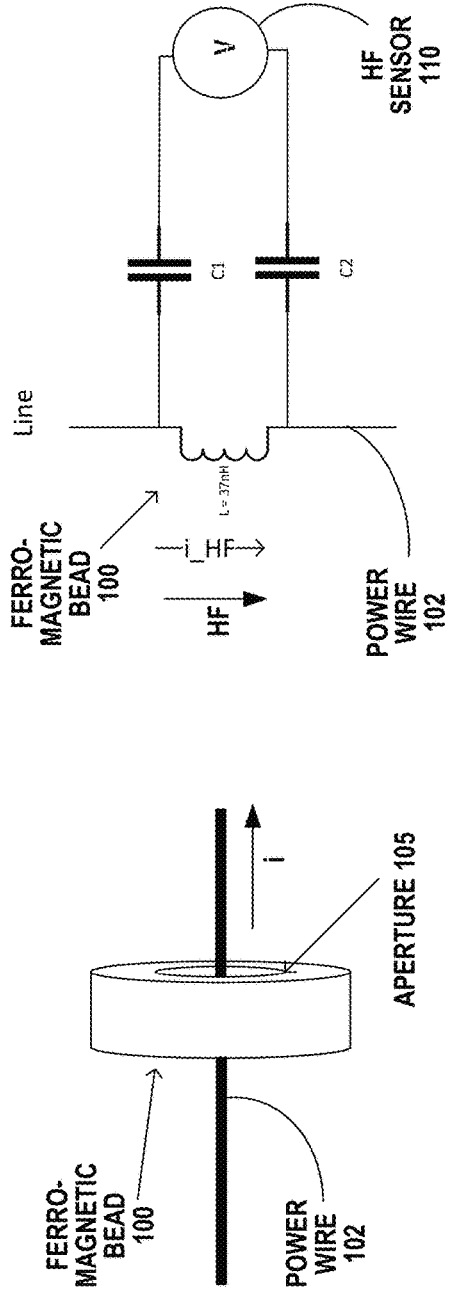
FIG. 1A
FIG. 1B
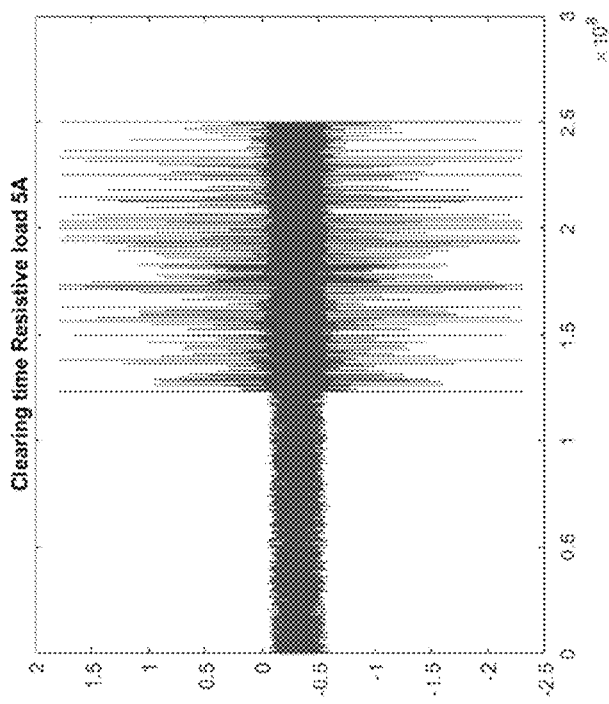
FIG. 1C

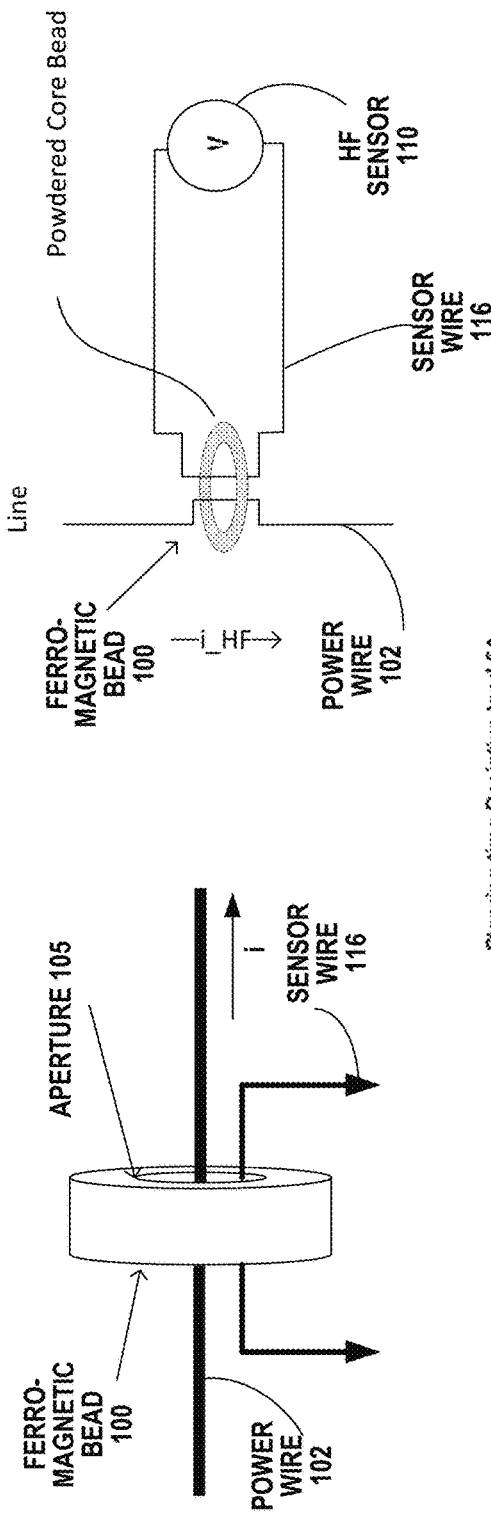
FIG. 3A
FIG. 3B
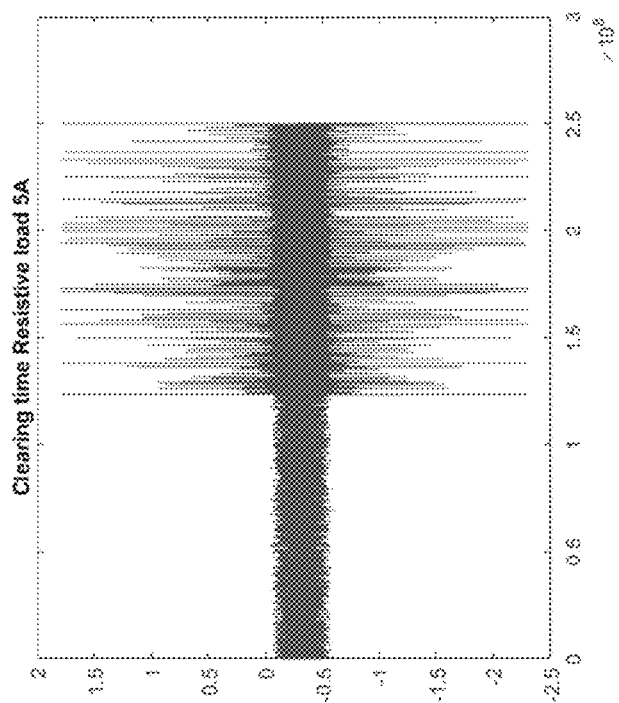
FIG. 3C

B1L – BEAD SENSOR FULL LENGTH CORE
BHL – BEAD SENSOR ½ LENGTH CORE
LIND – REFERENCE SENSOR
13T – SENSOR WITH SECONDARY WINDING
B2L+Hall – BEAD SENSOR WITH DOUBLE LENGTH CORE AND HALL EFFECT DEVICE

LOW COST HIGH FREQUENCY SENSOR FOR ARC-FAULT DETECTION

BACKGROUND OF THE INVENTION

1. Field of the Invention

The present disclosure relates generally to fault detection in electrical circuits and more particularly to devices to sense high frequency arc faults in power lines.

2. Description of Related Art

Arcing faults are commonly defined as current through ionized gas between two ends of a broken conductor in a wire supplying power to a load or at a faulty contact or connector, between two conductors supplying a load, or between a conductor and ground. Arc-faults have high frequency spectral components in the load current signature of an arcing load. Arc-fault circuit interrupter devices include components such as a microprocessor, memory, filters, analog-to-digital converters, and other supporting components to analyze the current and rise time signals to make a trip decision.

A low cost and small device is very advantageous for accurately detecting arc faults.

BRIEF SUMMARY OF THE INVENTION

In accordance with an example embodiment of the invention, a powdered core bead body, such as a ferromagnetic bead, is configured to become an inductive impedance to current signals with radio frequencies (RF) between 1 MHz to 40 MHz flowing through a power wire passing through the bead. These RF signals passing through this inductive impedance may be measured as a voltage drop between both terminals of the power wire. The impedance increases with the frequency and is proportional with the voltage drop across the terminals. This voltage may be filtered and amplified through an analog front end of an Arc Fault Circuit Interrupter (AFCI) device.

In accordance with an example alternate embodiment of the invention, a sensing wire is positioned to pass once through an aperture of the bead body. The sensing wire is configured to sense an occurrence of high frequency current signals in the power wire and to provide an arc fault tripping indication in response to an occurrence of high frequency current signals in the power wire.

The resulting invention provides a smaller and simpler device for arc-fault detection.

BRIEF DESCRIPTION OF THE DRAWINGS

Example embodiments of the invention are depicted in the accompanying drawings that are briefly described as follows:

FIGS. 1A, 1B, 1C, and 2 illustrate the high frequency components of the sensor, configured to output high frequency voltage used for determining an arc fault and tripping indication, in accordance with the invention.

FIGS. 3A, 3B, 3C, and 4 illustrate the high frequency components of the sensor with a one-turn sensor wire, configured to output high frequency voltage used for determining an arc fault and tripping indication, in accordance with the invention.

DETAILED DESCRIPTION OF EMBODIMENTS OF THE INVENTION

Figure 2:
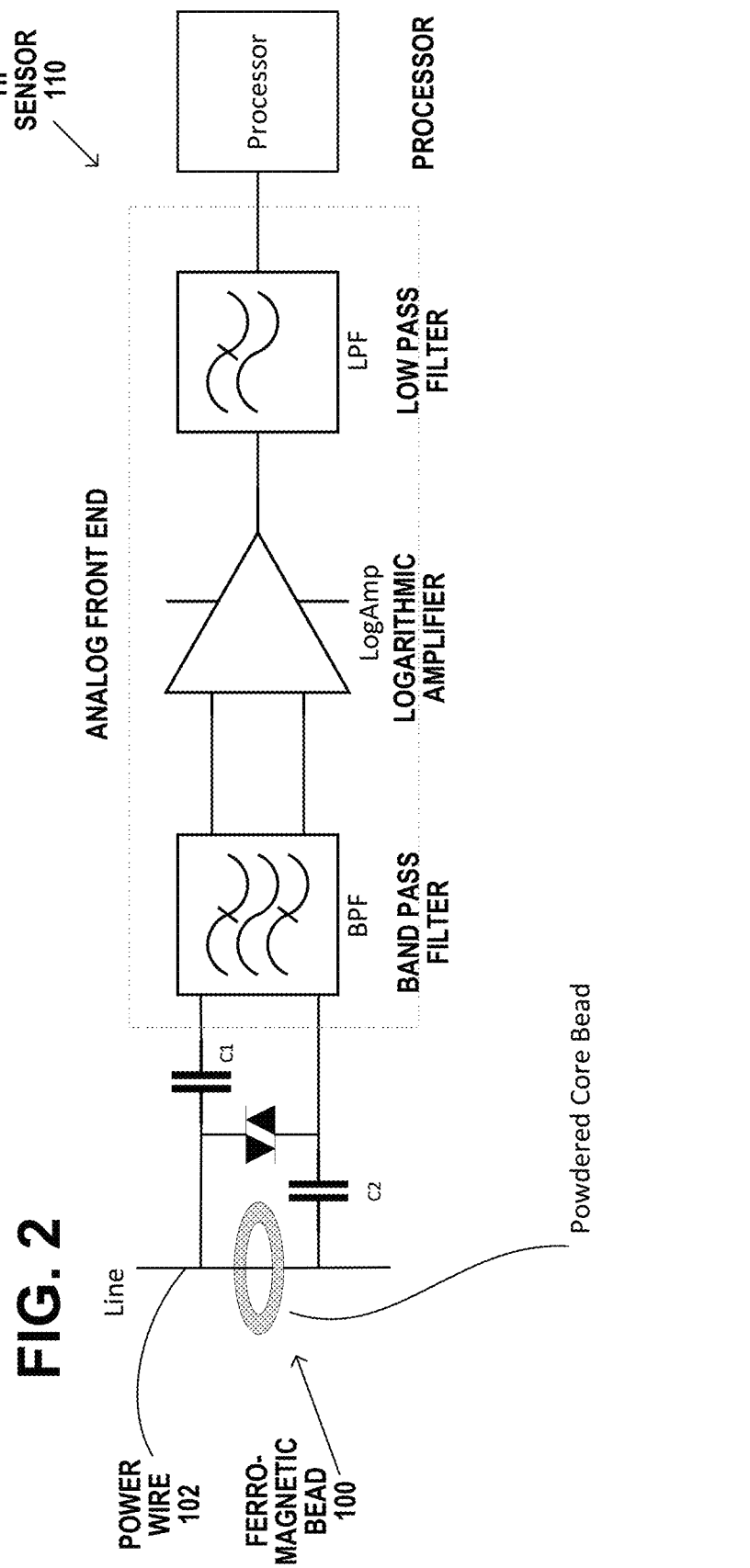
Figure 4:
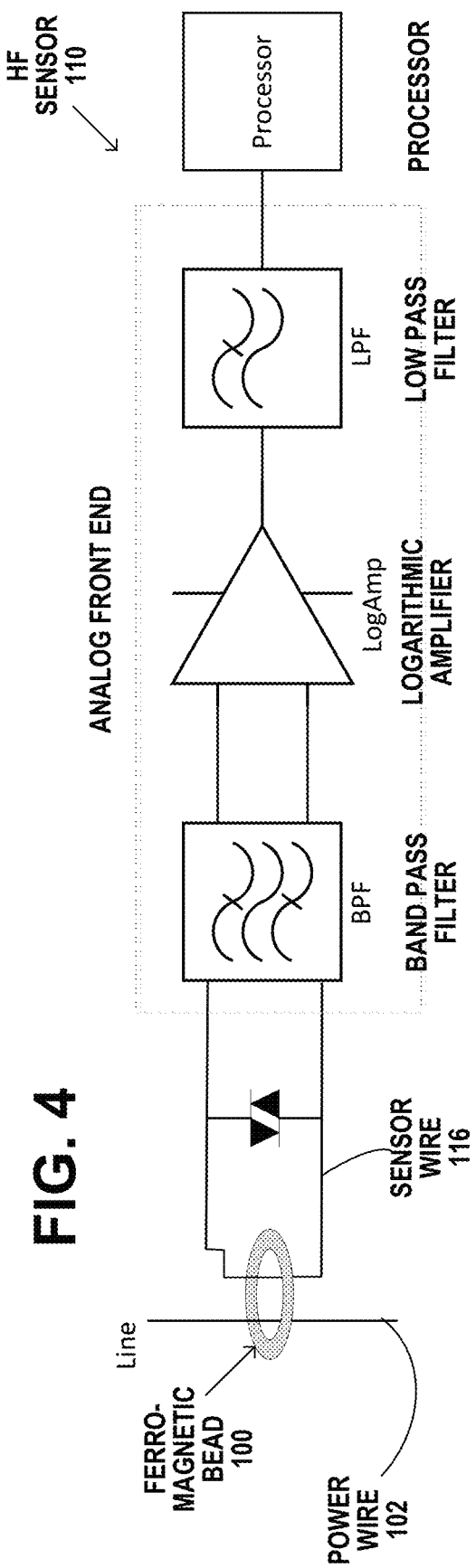

FIGS. 1A to 1C, and FIG. 2 illustrate examples of the high frequency components of the sensor, configured to output high frequency voltage used for determining an arc fault and tripping indication, in accordance with the invention. A powdered core bead body 100 has a generally cylindrical shape with a centralized circular aperture 105 through the bead body 100. A power wire 102 has a first portion passing into a first end of the aperture 104 and through the bead body 100 and a second portion passing out of a second end of the aperture 105. The powdered core bead body 100 has a low relative magnetic permeability $\mu=20$ up to 120, to minimize saturation by high currents in the power wire. Typical magnetic materials suitable for the powdered core bead body 100 include ferrites and magnetic oxides. The ferromagnetic bead 100 becomes an inductive impedance in response to current signals with high frequencies in a power wire 102 passing through the aperture of the bead 100. This may be used to provide an arc fault tripping indication in response to an occurrence of high frequency current signals in the power wire 102.

A high frequency voltage sensor 110 (FIG. 2) has a first input terminal coupled to the first portion of the power wire 102 and a second input terminal coupled to the second portion of the power wire 102. High frequency current signal may be received by directly connecting to the power wire via isolation capacitors C1 and C2, a diode voltage clamp, and the analog front end (AFE). The analog front end (AFE) includes a band pass filter (BPF), a logarithmic amplifier, a low pass filter (LPF), and a processor for sampling and analyzing the signal using arc fault detection algorithms.

Figure 6:
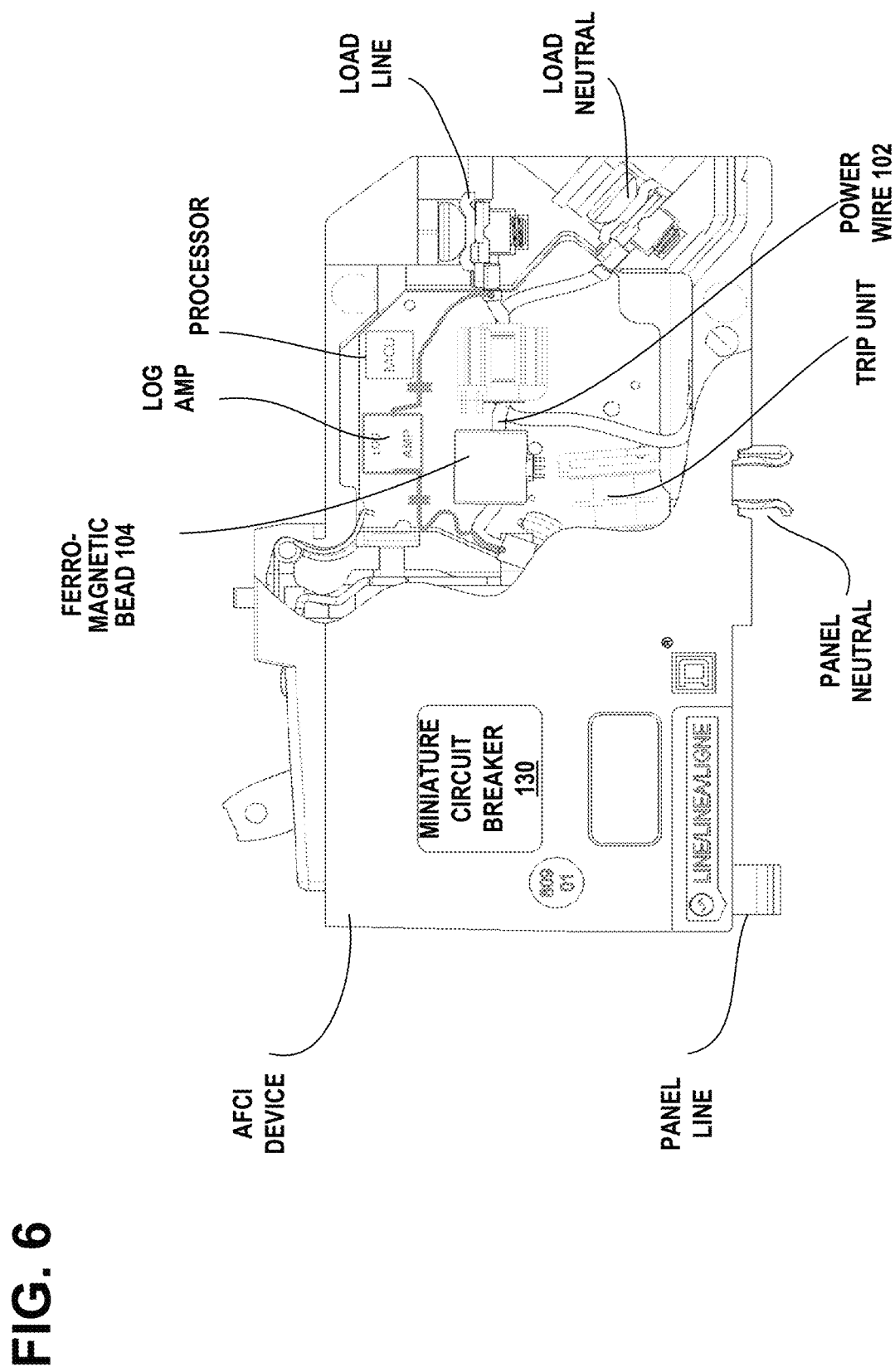
FIG. 6 illustrates an example implementation of the high frequency current sensor, in accordance with the invention.

An arc fault tripping circuit interrupter (AFCI) in the miniature circuit breaker 130 of FIG. 6, may be configured to interrupt electrical current in the power wire 102, if an output from the high frequency voltage sensor 110 indicates that an arc-fault is detected in the power wire 102; the arc fault tripping circuit interrupter (AFCI) having an input coupled to the high frequency voltage sensor 110.

In accordance with an example alternate embodiment of the invention shown in FIGS. 3A to 3C and FIG. 4, a sensing wire 116 is positioned to pass once through the aperture 105 of the bead body 100. The sensing wire 116 is effectively a secondary coil for sensing the induced high frequency signals from the power wire 102. The sensing wire 116 is configured to sense an occurrence of high frequency current signals in the power wire 102 and to provide an arc fault tripping indication in response to an occurrence of high frequency current signals in the power wire 102. The high frequency current signal may be received by the sensor wire 116 serving as a single turn secondary loop connected to the analog front end (AFE). High frequency current signal may be received by directly connecting to the sensor wire 116 via a diode voltage clamp and the analog front end (AFE). The analog front end (AFE) includes a band pass filter (BPF), a logarithmic amplifier, a low pass filter (LPF), and a processor for sampling and analyzing the signal using arc fault detection algorithms.

Figure 5A:
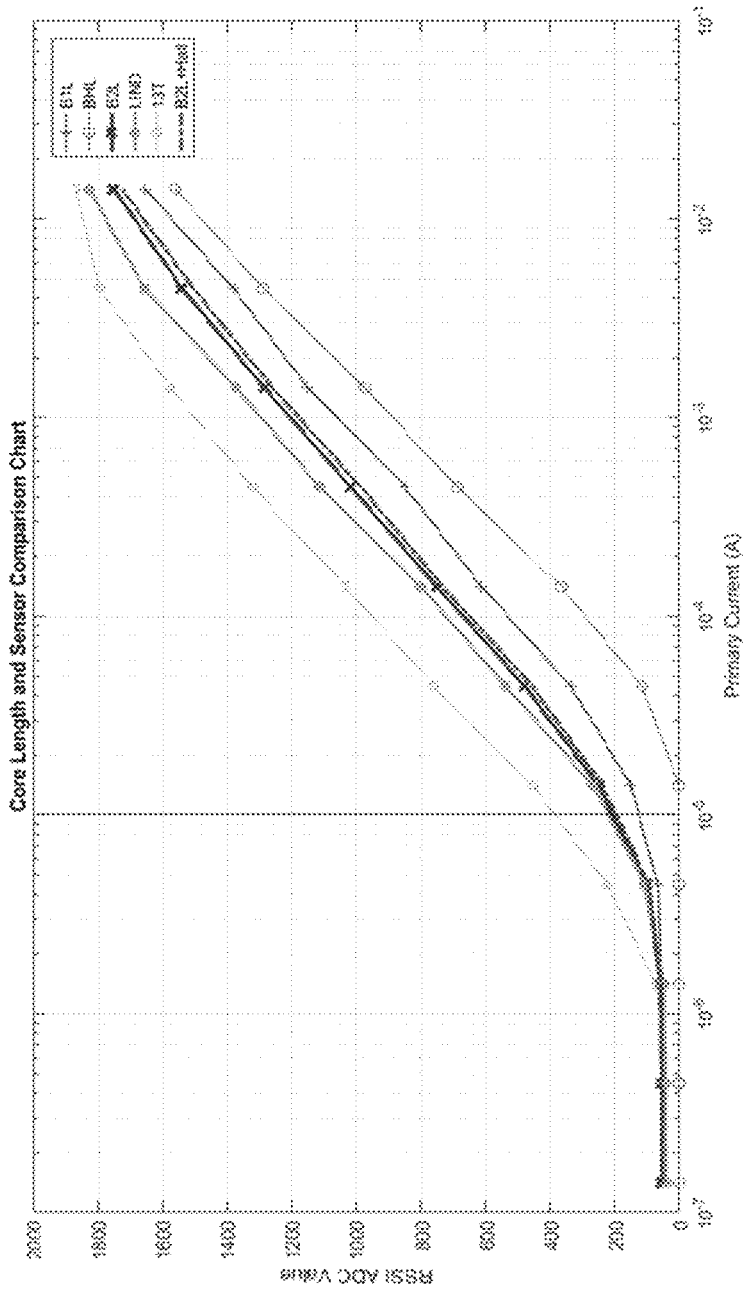
FIGS. 5A and 5B are graphs illustrating the demodulated output from high frequency primary current sensing and impedance transfer function respectively, in accordance with the invention.

FIG. 5A is a graph illustrating the demodulated output from high frequency primary current sensing in a frequency range of 1 MHz to 40 MHz. The abscissa is the primary current from $10^{-7}$ to $10^{-1}$ Amperes. The ordinate is the RSSI ADC value from 0 to 2000, based on a specific Logarithmic Amplifier and ADC resolution. RSSI stands for Received Signal Strength Indication and ADC stands for Analog to Digital Converter. The traces compare various core lengths and sensor types. In FIG. 5A, B1L stands for BEAD SENSOR FULL LENGTH CORE, BHL stands for BEAD SENSOR ½ LENGTH CORE, LIND stands for REFERENCE SENSOR, 13T stands for SENSOR WITH A 13 TURN SECONDARY WINDING, and B2L+Hall stands for BEAD SENSOR WITH DOUBLE LENGTH CORE AND HALL EFFECT DEVICE. Note: A full length core is a relative length based on the inductance expected for the sensor to detect frequencies from 1 MHz up to 40 MHz and a certain output level for the logarithmic amplifier input impedance. The graph shows how changing just the length of the core, changes the sensitivity of the RF signal.

Figure 5B:
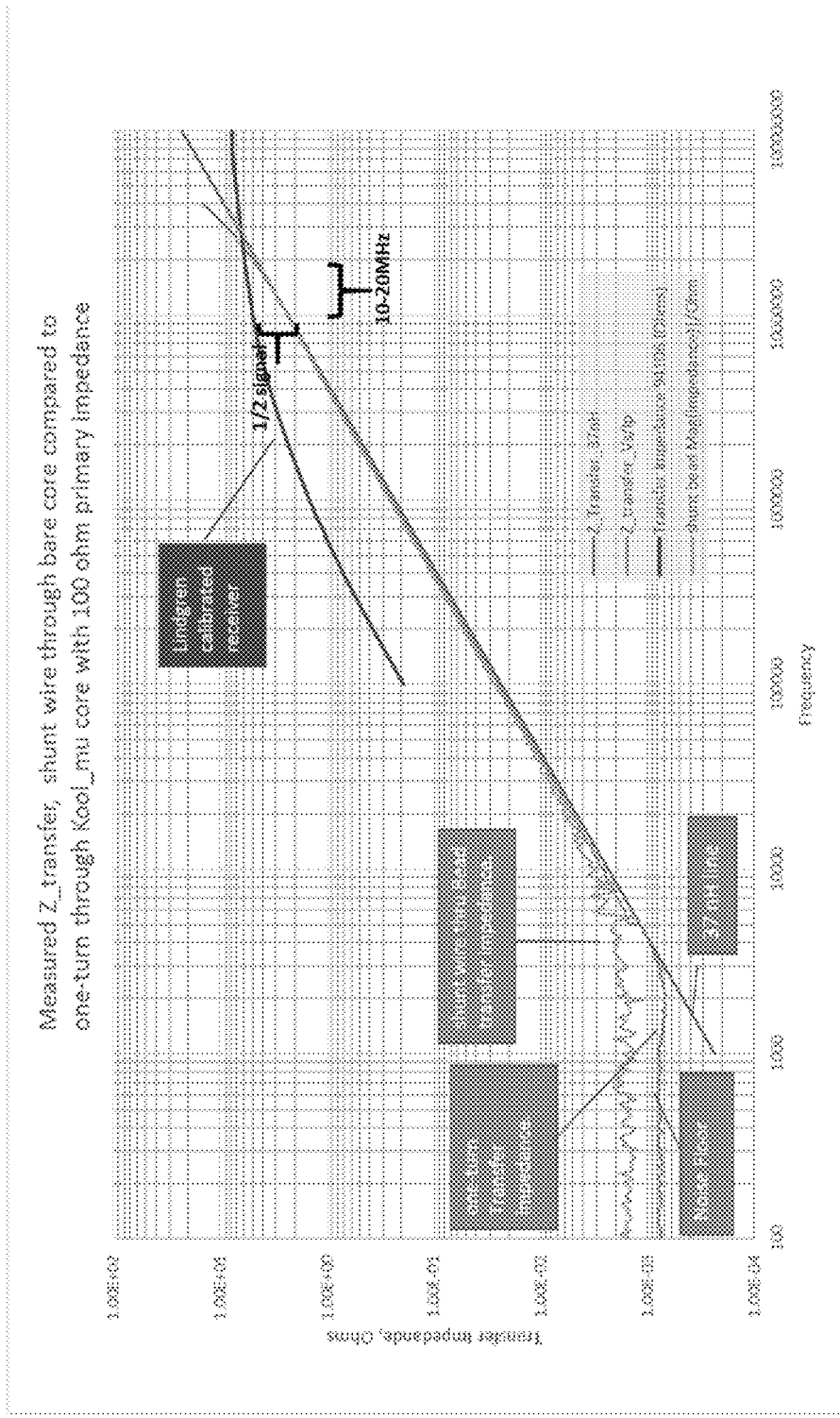

FIG. 5B is a graph comparing the transfer impedance of the sensor of FIG. 1A with the transfer impedance of the sensor of FIG. 3A that includes a sensing wire 116 passing once through the aperture 105 of the bead body 100.

FIG. 6 illustrates an example implementation of the high frequency current sensor, in accordance with the invention. A miniature circuit breaker 130 includes the high frequency current sensor 104. RF signals passing through the inductive impedance of the sensor 104 may be measured as a voltage drop between both terminals of the power wire 102. The impedance increases with the frequency and is proportional with the voltage drop across the terminals. This voltage may be filtered and amplified through an analog front end of an Arc Fault Circuit Interrupter (AFCI) device. This high frequency current may be used by an Arc Fault detection algorithm in the AFCI to determine the trip time, for example based on Underwriters Laboratories Inc. (UL) and International Electrotechnical Commission (IEC) standards. The miniature circuit breaker 130 is shown in FIG. 6, including the high frequency current sensor 104, log amp, processor, load line, load neutral, power wire 102, trip unit, panel neutral terminal, panel line terminal, and AFCI device.

The shape of the powdered core bead body 100 provides a compact and low cost solution for sensing high frequency arc faults. The high frequency current sensor 104 may be readily adapted for implementation in a monolithic solid-state design, which may be used, as an example, for fastening to a bus bar.

Among the advantages of the invention, are the following:
Reduced number of sensors for high frequency currents:
a) Single package sensor; smaller footprint
Low cost manufacturing sensor:
a) Solid design;
b) No winding wires;
c) Single bead with low relative permeability μ=20 up to 120;
d) No passive or active integrator circuit required; and
e) Fast response.
Simplicity in installation, reduced assembly cost:
a) The bead sensor may be molded to a single core for easy assembly.
b) Flexible shape and form of the sensor to fit the design constraints.
Optimization capability for space and sensitivity.

Although specific example embodiments of the invention have been disclosed, persons of skill in the art will appreciate that changes may be made to the details described for the specific example embodiments, without departing from the scope of the invention as defined in the attached claims.

The invention claimed is:

1. A high frequency sensor for arc fault detection, comprising:
a powdered core bead body having a magnetic permeability, configured to become an inductive impedance in response to current signals with high frequencies in a power wire passing through the bead and to provide an arc fault tripping indication in response to an occurrence of high frequency current signals in the power wire, the powdered core bead body having a generally cylindrical shape with a centralized circular aperture through the bead body, with a first portion of the power wire passing into a first end of the aperture and through the bead body and a second portion of the same power wire passing out of a second end of the aperture; and
a high frequency voltage sensor having a first input terminal connected via first isolation capacitor to the first portion of the power wire passing into the first end of the aperture through the bead body and a second input terminal connected via second isolation capacitor to the second portion of the same power wire passing out of the second end of the aperture through the bead body, configured to provide the arc fault tripping indication in response to the occurrence of high frequency current signals in the power wire.

2. The high frequency sensor for arc fault detection of claim 1, further comprising:
an arc fault tripping circuit coupled to the high frequency voltage sensor, configured to interrupt electrical current in the power wire, if an output is received from the high frequency voltage sensor indicating that an arc-fault is detected.

3. The high frequency sensor for arc fault detection of claim 1, wherein the powdered core bead body is configured to become an inductive impedance to current signals in the power wire with frequencies between 1 MHz to 40 MHz.

4. The high frequency sensor for arc fault detection of claim 1, wherein the powdered core bead body is composed of a ferromagnetic material.

5. The high frequency sensor for arc fault detection of claim 1, wherein changing length of the cylindrical core bead body, changes sensitivity of the high frequency voltage sensor to the high frequency current signals in the power wire.

6. A miniature circuit breaker, comprising:
a high frequency voltage sensor having a first input terminal connected via a first isolation capacitor to a first portion of a power wire passing into a first end of an aperture through a powdered core bead body having a magnetic permeability and a second input terminal connected via second isolation capacitor to a second portion of the same power wire passing out of a second end of the aperture through the powdered core bead body, configured to provide an arc fault tripping indication in response to an occurrence of high frequency current signals in the power wire;
the powdered core bead body configured to become an inductive impedance in response to the high frequency current signals in the power wire passing through the bead and to provide the arc fault tripping indication in response to the occurrence of the high frequency current signals in the power wire, the powdered core bead body having a generally cylindrical shape with the centralized circular aperture through the bead body; and an arc fault tripping circuit interrupter connected to the high frequency current sensor, configured to interrupt electrical current in the power wire in response to the arc fault tripping indication.

7. The miniature circuit breaker of claim 6, wherein the powdered core bead body is configured to become an inductive impedance to current signals in the power wire with frequencies between 1 MHz to 40 MHz.

8. The miniature circuit breaker of claim 6, wherein the powdered core bead body is composed of a ferromagnetic material.

9. The miniature circuit breaker of claim 6, wherein changing length of the cylindrical core bead body, changes sensitivity of the high frequency voltage sensor to the high frequency current signals in the power wire.

* * * * *